US 8,297,319 B2
Oct. 30, 2012

United States Patent
Babbs et al.

(54) CARRIER GAS SYSTEM AND COUPLING SUBSTRATE CARRIER TO A LOADPORT

(75) Inventors: Daniel Babbs, Austin, TX (US); William Fosnight, Carlisle, MA (US)

(73) Assignee: Brooks Automation, Inc., Chelmsford, MA (US)

(*) Notice: Subject to any disclaimer, the term of this patent is extended or adjusted under 35 U.S.C. 154(b) by 1173 days.

(21) Appl. No.: 11/855,484

(22) Filed: Sep. 14, 2007

(65) Prior Publication Data
US 2008/0107506 A1    May 8, 2008

Related U.S. Application Data

(60) Provisional application No. 60/825,704, filed on Sep. 14, 2006.

(51) Int. Cl.
*B65B 31/00* (2006.01)

(52) U.S. Cl. .......... 141/4; 141/48; 141/51; 141/95; 141/98; 414/939; 414/940; 206/710

(58) Field of Classification Search .......... 141/4–5, 141/47–48, 51, 95; 414/935, 939, 940; 206/710–711
See application file for complete search history.

(56) References Cited

U.S. PATENT DOCUMENTS

| | | | |
|---|---|---|---|
| 4,668,484 A | 5/1987 | Elliott | 422/113 |
| 4,816,098 A | 3/1989 | Davis et al. | 156/345.31 |
| 4,832,778 A | 5/1989 | Davis et al. | 156/345.31 |
| 4,846,345 A | 7/1989 | Hamuro et al. | 206/701 |
| 4,872,938 A | 10/1989 | Davis et al. | 156/345.54 |
| 4,911,103 A | 3/1990 | Davis et al. | 118/725 |
| 5,044,871 A | 9/1991 | Davis et al. | 414/805 |
| 5,255,783 A | 10/1993 | Goodman et al. | 206/334 |
| 5,318,207 A | 6/1994 | Porter et al. | |
| 5,320,218 A | 6/1994 | Yamashita et al. | 206/213.1 |
| 5,351,415 A | 10/1994 | Brooks et al. | 34/389 |
| 5,411,358 A | 5/1995 | Garric et al. | 414/277 |
| 5,575,081 A | 11/1996 | Ludwig | 34/218 |
| 5,611,452 A | 3/1997 | Bonora et al. | 220/378 |
| 5,630,690 A | 5/1997 | Salzman | 414/217.1 |
| 5,644,855 A | 7/1997 | McDermott et al. | 34/516 |
| 5,664,679 A | 9/1997 | Schneider et al. | 206/711 |

(Continued)

FOREIGN PATENT DOCUMENTS

DE    197 31 174    6/2002

(Continued)

OTHER PUBLICATIONS

Pelissier, B. et al. "XPS Analysis with an ultra clean vacuum substrate carrier for oxidation and airborne molecular contamination prevention." LTM-CNRS/CEA-LETI, Grenoble, France. Microelectric Engineering, vol. 85, No. 1, Jan. 2008, pp. 151-155.

(Continued)

*Primary Examiner* — Gregory Huson
*Assistant Examiner* — Nicolas A Arnett
(74) *Attorney, Agent, or Firm* — Perman & Green, LLP; Colin C. Durham

(57) ABSTRACT

A method for pressurizing a substrate carrier including pressurizing a chamber that is of unitary construction with the carrier and/or a substrate cassette within the carrier and maintaining a pressure within the carrier by releasing gas from the chamber into the carrier.

8 Claims, 5 Drawing Sheets

U.S. PATENT DOCUMENTS

| | | | |
|---|---|---|---|
| 5,810,062 A | 9/1998 | Bonora et al. | 141/351 |
| 5,879,458 A * | 3/1999 | Roberson et al. | 414/935 |
| 5,895,191 A | 4/1999 | Bonora et al. | 414/217 |
| 5,988,233 A | 11/1999 | Fosnight et al. | 141/63 |
| 6,082,951 A | 7/2000 | Nering et al. | 414/217.1 |
| 6,135,168 A | 10/2000 | Yang et al. | 141/98 |
| 6,176,023 B1 | 1/2001 | Doche | 34/451 |
| 6,220,808 B1 | 4/2001 | Bonora et al. | 414/217 |
| 6,221,163 B1 * | 4/2001 | Roberson et al. | 414/935 |
| 6,261,044 B1 | 7/2001 | Fosnight et al. | 414/217 |
| 6,309,161 B1 | 10/2001 | Hofmeister | 414/221 |
| 6,319,297 B1 | 11/2001 | Fosnight | 55/318 |
| 6,347,919 B1 | 2/2002 | Ryan et al. | |
| 6,352,403 B1 | 3/2002 | Fishkin et al. | 414/805 |
| 6,382,896 B1 | 5/2002 | Hu et al. | 414/217 |
| 6,398,475 B1 | 6/2002 | Ishikawa | 414/217 |
| 6,403,945 B2 | 6/2002 | Roessler et al. | 250/221 |
| 6,473,996 B1 | 11/2002 | Tokunaga | 34/417 |
| 6,530,736 B2 | 3/2003 | Rosenquist | 414/411 |
| 6,579,052 B1 | 6/2003 | Bonora et al. | |
| 6,637,998 B2 | 10/2003 | Langan et al. | 414/217 |
| 6,719,517 B2 | 4/2004 | Beaulieu et al. | 414/217 |
| 6,758,876 B2 | 7/2004 | Suzuki et al. | 55/385.6 |
| 6,796,763 B2 | 9/2004 | Miyanjima et al. | 414/805 |
| 6,883,539 B2 * | 4/2005 | Inoue et al. | 141/98 |
| 6,899,145 B2 | 5/2005 | Aggarwal | 141/11 |
| 6,901,971 B2 * | 6/2005 | Speasl et al. | 414/940 |
| 6,926,029 B2 * | 8/2005 | Inoue et al. | 141/98 |
| 6,991,416 B2 | 1/2006 | del Puerto et al. | 414/331.14 |
| 7,077,173 B2 | 7/2006 | Tokunaga | 141/66 |
| RE39,241 E | 8/2006 | Fosnight | 55/318 |
| 7,115,891 B2 | 10/2006 | Komatsu | 250/559.4 |
| 7,156,129 B2 * | 1/2007 | Speasl et al. | 414/940 |
| 7,172,981 B2 | 2/2007 | Kobayashi | 438/800 |
| 7,694,700 B2 * | 4/2010 | Bernard et al. | 414/940 |
| 2003/0035713 A1 | 2/2003 | Tsai et al. | 414/800 |
| 2004/0013498 A1 | 1/2004 | Soucy et al. | 414/217 |
| 2005/0105997 A1 | 5/2005 | Englhardt et al. | 414/626 |
| 2006/0038695 A1 | 2/2006 | Isaacs | |
| 2006/0045665 A1 | 3/2006 | Hall et al. | |
| 2006/0182531 A1 | 8/2006 | Shah et al. | 414/217 |
| 2006/0238476 A1 | 10/2006 | Park et al. | 414/935 |
| 2006/0239803 A1 | 10/2006 | Nagata | 414/411 |
| 2006/0266011 A1 | 11/2006 | Halbmaier et al. | 55/385.6 |
| 2007/0059127 A1 | 3/2007 | Guo et al. | 414/217 |
| 2007/0186851 A1 | 8/2007 | Geiser et al. | 118/719 |
| 2008/0031709 A1 | 2/2008 | Bonora et al. | 414/217 |
| 2008/0080963 A1 | 4/2008 | Bufano et al. | 414/788 |
| 2008/0107506 A1 | 5/2008 | Babbs et al. | 414/217 |
| 2008/0107507 A1 | 5/2008 | Bufano et al. | 414/217.1 |
| 2008/0112784 A1 | 5/2008 | Rogers et al. | 414/411 |

FOREIGN PATENT DOCUMENTS

| | | |
|---|---|---|
| EP | 1 035 574 | 9/2000 |
| EP | 1 343 202 | 9/2003 |
| GB | 2 139 424 | 11/1984 |
| GB | 2196939 | 5/1988 |
| GB | 2 419 035 | 4/2006 |
| JP | 02-174244 | 7/1990 |
| JP | 2-174244 | 7/1990 |
| JP | 07-066267 | 3/1995 |
| JP | 07-066272 | 3/1995 |
| JP | 11-217119 | 8/1999 |
| JP | 11-243140 | 9/1999 |
| JP | 11-345863 | 12/1999 |
| JP | 2001-189371 | 7/2001 |
| JP | 2002-033379 | 1/2002 |
| JP | 2005-197431 | 7/2005 |
| WO | 99/54927 | 10/1999 |
| WO | 02/19392 | 3/2002 |
| WO | 2006/108032 | 10/2006 |
| WO | 2007/019105 | 2/2007 |
| WO | 2007/078407 | 7/2007 |
| WO | 2007/133701 | 11/2007 |

OTHER PUBLICATIONS

Hu et al., "Particle dynamics in a front-opening unified pod/load port unit mini environment in the presence of a 300 mm wafer in various positions." Aerosol Sciience and Technology, v39, n3, Mar. 2005, pp. 185-195.

Hu, et al. "Design and evaluation of a nitrogen purge system for the front opening unified pod (FOUP)." Applied Thermal Engineering, v27, n8-9, Jun. 2007, p. 1386-1393.

Hu, et al. "Purging of front-opening unified pod with nitrogen for 300 mm wafer manufacturing." Japanese Journal of Applied Physics, Part 1: Regular Papers and Short Notes and Review Papers, v45, n6A, 2006, p. 5269-5271.

Suzuki et al. "Evaluation of front-opening unified pod with attached UV/photocatalyst cleaning unit." Japanese Journal of Applied Physics, Part 1: Regular Papers and Short Notes and Review Papers, v44, n2, Feb. 2005, p. 1130-1131.

Hunter et al. "Trends in 300 mm factory automation." Semiconductor International v26, n6, Jun. 2003, p. 60-64.

Seita et al. "Improvement of 300mm FOUP mini-environment." IEEE International Symposium on Semiconductor Manufacturing, Proceedings 2001, p. 503-506.

Keyhani et al. "Purging FOUPs that open to front-end minienvironments using an inert-gas curtain." Micro, v22, n7, Aug.-Sep. 2004, p. 65-71.

"Asyst Technologies to license automated silicon wafer handling equipment system designed for next generation 12 inch wafers." Electronics Times, n774, p. 8. (Jul. 13, 1995).

International Search Report mailed Apr. 10, 2008, International application No. PCT/US0719951.

* cited by examiner

CARRIER GAS SYSTEM AND COUPLING SUBSTRATE CARRIER TO A LOADPORT

CROSS REFERENCE TO RELATED APPLICATIONS

This application claims priority to U.S. Provisional Patent Application No. 60/825,704, filed on Sep. 14, 2006, the disclosure of which is incorporated by reference herein in its entirety.

BACKGROUND

1. Field

The exemplary embodiments relate coupling a substrate carrier to a load port and to purging the substrate carrier.

2. Brief Description of Related Developments

Current substrate carriers such as, for example, front opening unified pods (FOUPs) for carrying semiconductor substrates are manufactured from polymer materials like polycarbonate, polyethylenes and the like. These materials have a molecular structure which is larger than the molecule size of, for example, inert gases such as nitrogen or argon. For this reason the carrier material may not be sufficient to contain the inert gas which will diffuse through the carrier shell until all of the gas is lost. Denser materials with a molecular structure smaller than the molecule size of the gas may be used but denser materials may add undesired weight to the carriers. The gases are used during substrate processing to control the environment local to the substrates which may have materials deposited on them that are susceptible to moisture or oxygen. Current gas purging systems rely on storage nests that are plumbed to a house gas supply and continuously input gas into the carrier to compensate for leaks. Separate gas containers that travel along with the substrate carriers may also be known.

Also, conventional substrate carriers are mechanically coupled to the loadport via features on the bottom surface of carrier for registration to or alignment with the tool. For front opening carriers, the door, which is opened to access the substrates, is located on one side of the carrier and is perpendicular to the bottom surface. The door locating and latching features mate with corresponding loadport features. This forms two planes on the substrate carrier which are to be aligned with respect to the mating loadport planes. This negatively impacts the quality of the interface when carriers are not in tolerance or a loadport is not properly adjusted. In addition, the cost of producing each part can be higher due to complications maintaining the relationships between the two planes. An example of a conventional substrate carrier can be found in U.S. Pat. No. 5,895,191 which discloses an angled sealing surface that creates a wedge shaped door that can be removed with a single vertical axis of motion, and the carrier relies on the bottom surface of the carrier for carrier registration.

It would be advantageous to have a gas purging system that is localized to the carrier and a load port coupling that reduces the degrees of freedom to register the carrier to a tool and open the door for substrate access.

SUMMARY

In one exemplary embodiment, a method for pressurizing a substrate carrier is provided. The method includes pressurizing a chamber that is of unitary construction with the carrier and/or a substrate cassette within the carrier and maintaining a pressure within the carrier by releasing gas from the chamber into the carrier.

In another exemplary embodiment, a substrate transport system is provided. The system includes a substrate transport carrier having a casing for holding and carrying a substrate substantially isolated from an outside atmosphere, the casing having at least one chamber capable of holding the substrate and a chamber atmosphere different from the outside atmosphere and a portable gas supply connected to the casing so that the gas supply and casing are movable as a unit, the gas supply being arranged to hold a supply of gas and to controllably exhaust gas from the supply into the at least one chamber so that the chamber atmosphere is maintained at a predetermined pressure.

In one exemplary embodiment, a method for coupling a substrate carrier to a port is provided. The method includes engaging at least one upper registration feature of the carrier with a corresponding one of at least one registration feature of the port, rotating the carrier and engaging the at least one lower registration feature of the carrier with a corresponding one of at least one lower registration feature of the port.

BRIEF DESCRIPTION OF THE DRAWINGS

The foregoing aspects and other features of the present embodiments are explained in the following description, taken in connection with the accompanying drawings, wherein.

DETAILED DESCRIPTION OF THE EXEMPLARY EMBODIMENT(S)

Figure 1:
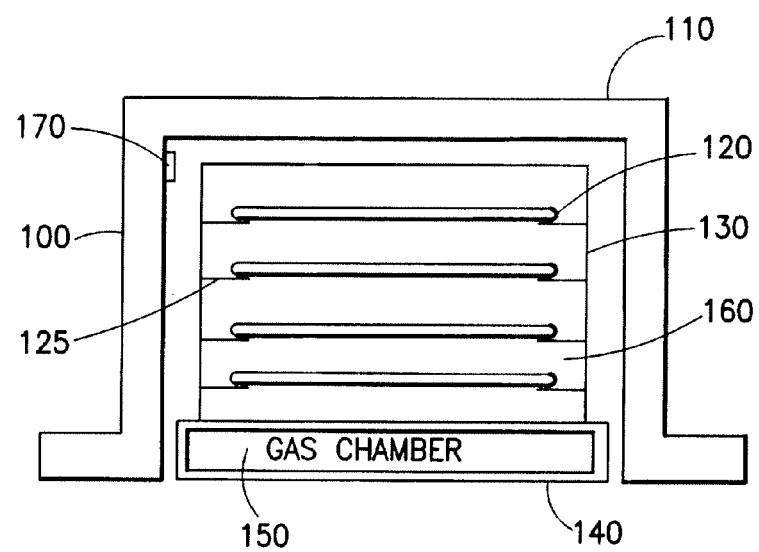
FIGS. 1, 1A and 1B illustrate schematic views of exemplary gas systems in accordance with an exemplary embodiment.

FIG. 1 illustrates a schematic view of a gas system in accordance with an exemplary embodiment. Although aspects of the invention will be described with reference to the exemplary embodiments shown in the drawings and described below, it should be understood that those aspects could be embodied in many alternate forms of embodiments. In addition, any suitable size, shape or type of elements or materials could be used.

As can be seen in FIG. 1, a substrate carrier 100 is shown. The substrate carrier may be a bottom opening carrier 100, a front opening unified pod (FOUP) (e.g. side opening) (see Ref. No. 100' in FIG. 1A), or any other suitable substrate transport device. The carrier 100 may be configured to carry, for example, semiconductor wafers, flat panels for flat panel displays, reticles/masks or any other suitable substrates or items. The semiconductor wafers may be, for example, 200 mm, 300 mm, 450 mm or any other suitable wafer. The substrate carrier 100 may be part of a transport system 280 such as an automated material handling system arranged throughout, for example, a fabrication facility (FAB) 200 to transport the carrier 100 to various stations 210-270 within the FAB (see FIG. 2).

The carrier may have a shell 110 and/or door (not shown in FIG. 1) that are constructed of any suitable material such as, for example a polymer material. The polymer materials may include, but are not limited to polycarbonate, polyethylenes and the like. The shell 100 may define a chamber or internal cavity 160 in which substrates or workpieces 120 may be carried in an environment capable of being isolated from an atmosphere exterior to the chamber 160. The shape of the carrier 100 shown in FIG. 1 is merely exemplary and in alternate embodiments the carrier may have any other suitable shape. The carrier 100 is illustrated as a bottom opening carrier that may be capable of accommodating a cassette 130 inside the chamber 160 for supporting substrates 120 within the carrier as shown. In alternate embodiments, the carrier may not have a cassette.

The substrate cassette 130 generally has elongated supports with substrate support shelves 125 distributed thereon to provide a row or stack of supports, or shelves on which one or more substrates may be individually supported as shown. In alternate embodiments, the carrier may have support shelves for more or fewer substrates. The cassette 130 may also include a base 140 as will be described below. The cassette 130 may be mounted or otherwise attached to the carrier structure. In alternate embodiments, the carrier 100 may not have a cassette, and the substrate supports may be integral or formed as a unitary construction with the carrier structure.

In the exemplary embodiment shown, the base 140 may include a gas chamber 150 or otherwise hollow volume of any suitable shape and/or size that is integral to or is of unitary construction with the base 140. In alternate embodiments, the chamber 150 may be located anywhere in the cassette. For example, the chamber 150 may be integral with any suitable portion of the cassette such as, for example, the sides, back or top of the cassette. In other alternate embodiments, the chamber 150 may be integral with any suitable portion of the carrier such as, for example, the carrier door, top, bottom or sides.

Figure 1A:
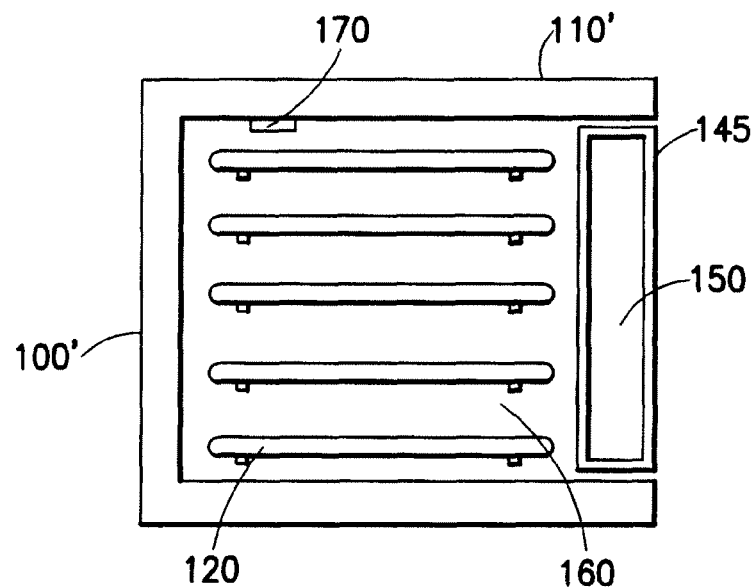

Referring to FIG. 1A, another exemplary carrier 100' is shown. In this embodiment the carrier is shown as a side or front loading carrier (e.g. FOUP type carrier). The carrier 100' may be substantially similar to carrier 100. The carrier 100' may have a shell 110' a door 145, a cavity 160 and any suitable substrate supports. The carrier 100' may be configured to carry any suitable substrates 120 such as those described above. In alternate embodiments the carrier 110' may be configured to house a substrate cassette substantially similar to cassette 130 described above. In this example, the chamber 150 may be incorporated into the door 145 of the carrier 100'. In alternate embodiments, the chamber 150 may be incorporated into or attached to any suitable part of the carrier 100'.

Figure 1B:
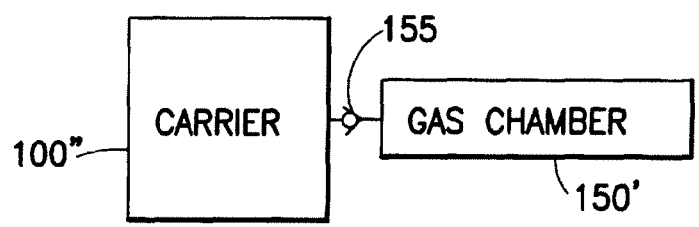

In still other embodiments as shown in FIG. 1B, the chamber may be a removable module 150' that may be joined to the carrier 100" via a coupling 155. The module 150' may be attached to any desired portion of the carrier 100". In alternate embodiments, the chamber 150 or module 150' may be incorporated into the cassette. In one embodiment the module 150' may be removed and/or replaced for replenishment of the chamber or may be replenished when connected to the carrier 100". The coupling may be any suitable coupling including, but not limited to quick connect/disconnect couplings or threaded couplings. The removable module 150' may be configured to attach to any suitable portion of the carrier 100" such as for example, the top, bottom or sides of the carrier. In one exemplary embodiment, the removable module 150' may be attached to an interface surface (e.g. any surface of the carrier that interfaces with or mates with, for example, any suitable component of a processing tool) and be configured to serve as the interface between the carrier 100" and the interfaced or mating device. It is noted that in the exemplary embodiments the chamber 150 may be used to purge the carrier or load lock of the tool.

Figure 2:
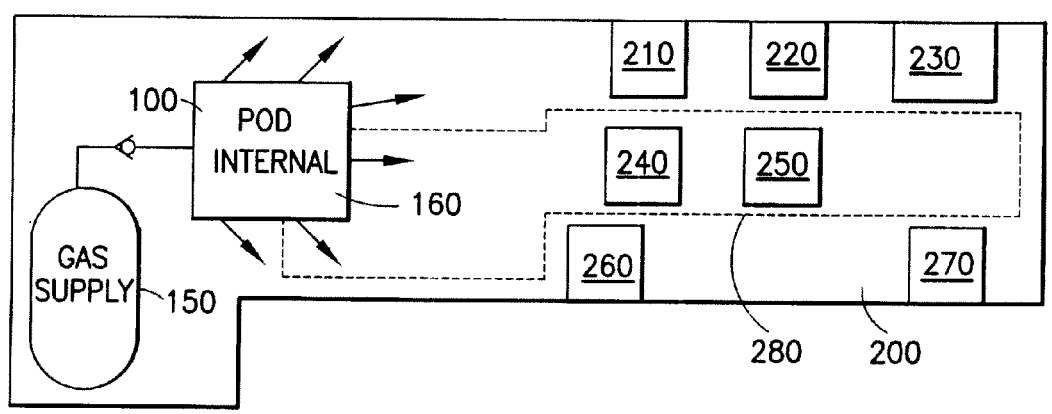
FIG. 2 illustrates a schematic view of a FAB in accordance with an exemplary embodiment.

The chamber 150 may be constructed of a material having a molecular structure smaller than the molecules of the gas held within the chamber to prevent the gas from leaking through the chamber walls and into the atmosphere as shown in FIG. 2. The chamber 150 may be constructed of, for example, a metal or a polymer. The chamber 150 may also have walls with a thin cross section to minimize weight gain from the denser material. In alternate embodiments, the cross section of the chamber material may have any suitable cross section. In other alternate embodiments, the chamber may be constructed of the same material as the cassette or carrier may be equipped with a liner made from the denser material.

The chamber 150 may be connected to the internal cavity 160 of the carrier or pod 100 through a check valve that may regulate the pressure inside the carrier 100 and prevent over pressurization of the carrier 100. In alternate embodiments, the chamber 150 may be connected to the internal cavity of the carrier in any suitable manner, such as for example an electronically controlled valve, any suitable regulatory valve or a direct connection.

The gas chamber 150 may be charged or replenished in any suitable manner. For example, referring to the substrate processing area or fabrication facility 200 shown in FIG. 2, a loadport of a tool 240, 250 may be plumbed to a house or centralized gas containment unit 270 so that when the carrier 100 is placed on the loadport, suitable couplings or fittings between the gas line on the loadport and the chamber are engaged. For example, a purge line connected to the carrier may be used to purge the carrier at the loadport. The couplings may be any suitable couplings such as, for example, pressure activated couplings or quick connect/disconnect couplings. The chamber 150 may be charged with gas via the couplings to a predetermined pressure while on the loadport. In alternate embodiments, the chamber 150 may be replenished by pressurizing the chamber interior. As can be seen in FIG. 2, the chamber 150 may be charged when, for example, the carrier 100 is placed on or in a nesting location 210, 220, 230 such as a buffer, carrier storage or stocker. The nesting locations 210-230 may be connected to any suitable gas source such as a house or centralized gas source 270. The gas may be transferred to the chamber 150 through any suitable coupling or fitting when the carrier 100 is placed in or on the nesting location 210-230. The nesting locations 210-230 may be placed in any suitable location within, for example, the FAB 200. The chamber may also be replenished in a strategically placed replenishing station 260. The replenishing station 260 may also be connected to a centralized gas supply such as the house gas supply 270. The strategically placed replenishing station 260 may be located at any suitable location within the FAB 200 including, but not limited to an ingress or egress to a storage area, in proximity to a stocker or a processing bay opening. The replenishing station 210-260 may be configured to provide remote maintenance of the carrier 100 through the chamber 150.

For example, the carrier 100 with the pressurized chamber 150 may be stored or transported for an extended period of time without connection to a gas supply thereby reducing the number of gas pipes running through a FAB 200. The number of replenishing stations 260 may also be reduced due to the gas chamber 150 and the ability to replenish the chamber 150 in the nesting locations or strategically placed replenishing station 260. In addition, to the carrier 100 being able to be stored or transported for a longer period of time the chamber 150 may allow for more precise control over the gas pressure within the carrier interior 160 because the carrier interior is no longer its own gas reservoir. For example, a higher gas pressure within the carrier 100 does not have to be applied to ensure that there is enough gas within the carrier 100 while the carrier 100 is being transported or stored. As a result of the more precise pressure control within the carrier 100, better temperature control within the carrier may also be obtained. The extended time period between recharging of the gas within the chamber 150 may be driven by the size of the chamber and the quality of the seals in the carrier and the carrier material.

In other exemplary embodiments, a pressure sensor 170 (see for example FIG. 1) may be incorporated into the carrier or a portion thereof to monitor the pressure in the internal cavity 160 of the carrier 150. In other alternate embodiments, the pressure sensor 170 may be located in any suitable location such as being connected to or in the chamber 150. The pressure sensor 170 may be provided with a suitable communication system to signal a suitable controller. The sensor 170 may also be provided with a suitable indicator on the carrier 100. The pressure sensor 170 may measure the pressure in the carrier 100 and/or the pressure within the chamber 150 and report a suitable alarm to, for example an operator or to a control computer of an automated material handling system (AHMS) if the pressure drops below a predetermined level. An operator may command the AHMS or the control computer may command the AHMS to retrieve the carrier 100 from its current position, such as a staging or storage position and place the carrier 100 on for example a purge nest for recharging of the chamber 150. In alternate embodiments, the gas chamber may be recharged manually or in any other suitable manner. Also, the pressure sensor 170 of the carriers may send periodic signals to the controller, allowing the controller to predict when replenishment is needed and schedule moving the carriers accordingly.

Figure 5:
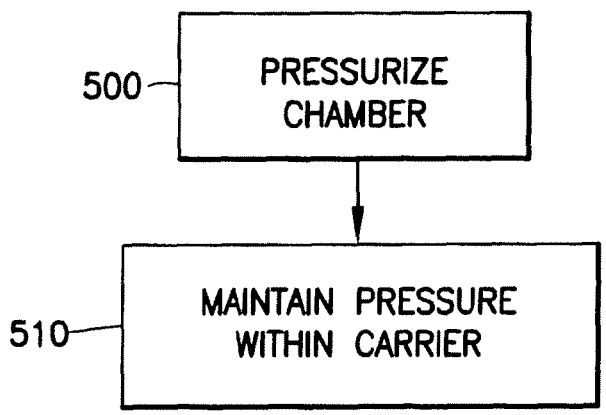
FIG. 5 shows a diagram of a method in accordance with an exemplary embodiment.

In operation, the carrier 100 is placed on a loadport or nesting station so that the chamber 150 is coupled to a gas supply line. The chamber 150 is pressurized to a predetermined pressure (FIG. 5, Block 500). The chamber 150 may maintain the pressure by, for example, releasing the pressurized gas from within the chamber via a check valve (or other suitable valve or connection), into the internal cavity 160 of the carrier 100 (FIG. 5, Block 510). Any decrease in pressure within internal cavity 160 of the carrier may be due to gas leakage through the carrier seals or walls while the carrier 100 is stored or transported.

Figure 3A:
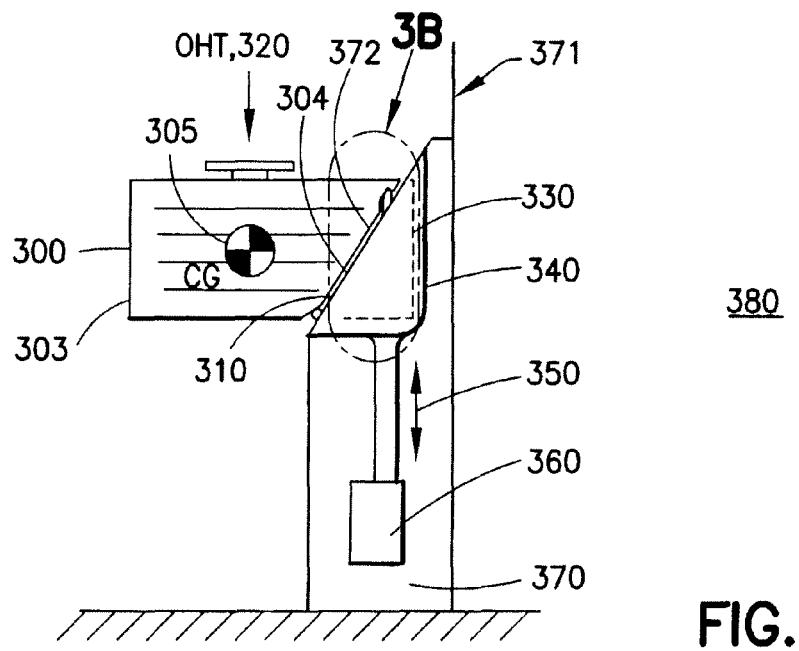
FIGS. 3A-C illustrate a system in accordance with an exemplary embodiment.
Figure 3B:
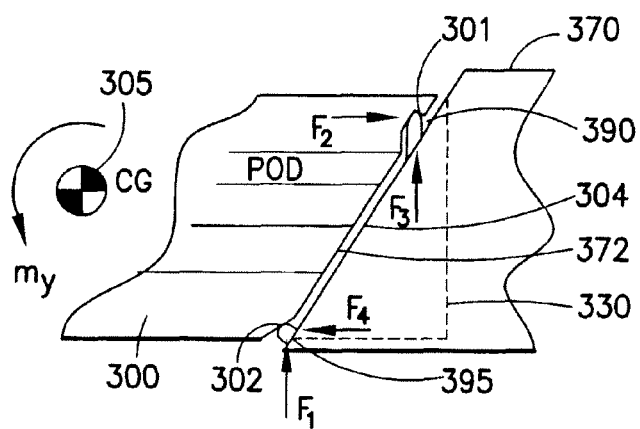

Referring now to FIGS. 3A-3B a substrate carrier 300 is shown interfacing with a processing station 380. The substrate carrier 300 may be any suitable carrier such as a carrier substantially similar to the carrier 100 described above or it may be a carrier without an integral gas chamber. In this exemplary embodiment the carrier 300 is shown as a front or side opening carrier but in alternate embodiments the carrier may be any other suitable substrate carrier. Substrates may be loaded and unloaded from the carrier in a direction substantially parallel with the wafer plane. The processing station 380 may be any suitable processing station such as, for example, an equipment front end module or a cluster tool. The processing tool may have multiple substrate processing chambers and substrate cassette elevators connected to the processing chambers. In alternate embodiments, the processing tool may have any suitable configuration. The carrier and processing station interface may be located along a single interface plane.

As can be seen in FIG. 3A the carrier 300 may be configured for use with an overhead transport system 320. In alternate embodiments, the carrier may be configured to be transported in any suitable manner such as by conveyor or manually or robotically controlled carts. In this exemplary embodiment the carrier 300 includes a shell 303 and a door 330.

The door 330 is shown in FIG. 3A as having a wedge shape (as viewed from the side of the door) but in alternate embodiments the door 330 may have any suitable shape. The interface between the door 330 and the shell 303 may include a seal for isolating the interior of the cassette 300 from an exterior atmosphere. Also, when the carrier is interfaced with the port of a processing station or tool 380 (for example a load port module 370), the carrier door and base may each have sealing interfaces for respectively sealing the carrier door 330 to the port door 340 and the carrier face 304 to the port 370 (see e.g. seal surface 310). In this exemplary embodiment, the sealing surface 310 and the interface between the carrier face 304 and the carrier door 330 are shown as being angled with respect to the box opener/loader-to-tool standard interface (BOLTS) plane 371. In alternate embodiments the sealing surface 310 and carrier face/door interface may have any suitable orientation such as, for example, parallel or perpendicular with the BOLTS plane 371.

Figure 3C:
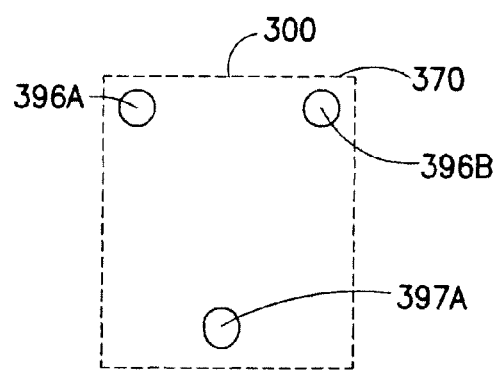

In this exemplary embodiment, as can be seen in FIGS. 3B and 3C, the carrier face 304 and the loadport face 372 (e.g. the carrier/loadport interface) are equipped with carrier registration features for aligning the carrier 300 with the loadport 370. The carrier registration features may be located on the same surface as the carrier/port door interface (e.g. the sealing surface 310) to eliminate over constraints on coupling the carrier to the loadport and minimize any misalignment between the carrier 300 and port 370 due to maintaining alignment between, for example, multiple interface surfaces, such as with conventional carrier registration methods (e.g. the bottom of the carrier and the carrier/port interface).

In this exemplary embodiment, the carrier face 304 is equipped with registration features for example, kinematic coupling features such as upper groove(s) or recess(es) 301 and a lower groove(s) or recess(es) 302. The Port face 372 is equipped with corresponding registration features for example, complementary kinematic coupling features such as upper protrusion(s) or pin(s) 390 for engaging the upper recess(es) 301 and a lower protrusion(s) or pin(s) 302 for engaging the lower recess(es) 302 for deterministic repeatable positioning of the carrier on the port face. In alternate embodiments the pins may be located on the carrier face and the recesses may be located on the port face. In other alternate embodiments, any suitable engaging devices may be utilized as registration features such as, for example, hooks and loops, L-shaped pins and recesses, balls and sockets, or any other connection that does not over-constrain the interface as will be described below. The registration features may be located on the carrier face 304 and the port face 372 so that the carrier door 330 and port door 340 may be removed or otherwise opened without interfering with registration features, the sealing surface 310 or interaction between the carrier door 330 and the port door 340. For example, the registration features of the carrier may be located on an outer periphery of the carrier face 304 such as, for example, along a lip or frame surrounding the carrier door 330. The registration features of the loadport 370 may be similarly located around a lip or frame surrounding the port door 340. The seal interface between the carrier, carrier door, port frame and port door may be similar to that described in U.S. patent application Ser. No. 11/556,584 filed on Nov. 3, 2006; Ser. No. 11/787, 981 filed on Apr. 18, 2007; Ser. No. 11/803,077 filed on May 11, 2007; and Ser. No. 11/891,835 filed on Aug. 13, 2007 which are incorporated herein by reference in their entireties.

The registration features 390, 395, 301, 302 may be configured to stably hold and align the carrier 300 with the port 370. For example, the grooves or recesses 301, 302 may have a v-groove or concave shape so that the corresponding pins 390, 395 of the port face 372 are guided to, for example, a centerline of the recess 301, 302 to achieve repeatable alignment of the pins and recesses. Similarly, the pins 390, 395 may have a corresponding grooved or convex shape for mating with the recesses 301, 302. In alternate embodiments the recesses 301, 302 and pins 390, 395 may have any suitable shape, such as for example conical or spherical, that allows for repeatable placement of the carrier 300 on the port 370.

As can be seen in FIG. 3C, three sets of registering features 396A, 396B, 397A, such as the pins and recesses described above, may be utilized to deterministically position and stably hold the carrier 300 against the port 370. In this exemplary embodiment, two sets of upper registration features 396A, 396B and one set of lower registration features 397A, which form a triangle may be utilized to hold and align the carrier 300 to the port 370. In alternate embodiments, more or less registration features may be utilized to define the deterministic kinematic coupling between the carrier and port. For example, there may be two sets of upper registration features and two sets of lower registration features, one set of upper registration features and two sets of lower registration features, one set of upper registration features and one set of lower registration features and so on. In other alternate embodiments any suitable number of upper and lower registration features may be utilized. In still other alternate embodiments any combination of types of registration features may also be utilized, for example any combination of the hooks and loops, balls and sockets and/or pins and grooves may be utilized. In yet other alternate embodiments, the seal surface 310 or any other suitable features may impart additional rotational stability to the registration features. The registering features of the kinematic coupling may be established with reference to the wafer transport plane of the processing station while allowing a free and unhampered interface with the automated material handling transport system, loading and unloading the carrier to the port, which may be aligned to the FAB floor.

In this exemplary embodiment the center of gravity 305 of the carrier 300 is utilized to impart the forces that preload the coupling in the mechanically stable condition described above. In alternate embodiments the forces for the mechanically stable condition may be obtained in any suitable manner such as for example, by springs, guides, levers, linear or rotational actuators and the like acting on the cassette.

Here, the upper pin(s) 390 may engage the upper recess(es) 301 before the lower pin(s) 395 engage the lower recess(es) 302. Reactive forces F2 and F3 exerted by the upper pin(s) 390 on the upper recess(es) 301 acting simultaneously with the gravitational forces present at the center of gravity 305 of the carrier 300 may impart a moment My causing the carrier to rotate about the engagement point(s) between the upper pin(s) 390 and the upper recess(es). The moment My may also effect the locking together or securing of the engagement between the upper pin(s) and upper recess(es). The rotation or moment My about the upper engagement point(s) may urge the lower recess(es) 302 to engage the lower pin(s) 395 so that reactive forces F1 and F4 are exerted on the carrier 300 to prevent further rotation of the carrier 300. In this exemplary embodiment the engagement between the upper and lower registration features holds the carrier 300 on the loadport 370. In alternate embodiments, a live support may be utilized to assist in holding the carrier 300 on the loadport 370. For example, a spring loaded vertical support may be utilized to lessen the forces exerted on or by the registration features and to partially vertically support the carrier while at the same time allowing for the preloading of the registration features as described above.

Figure 6:
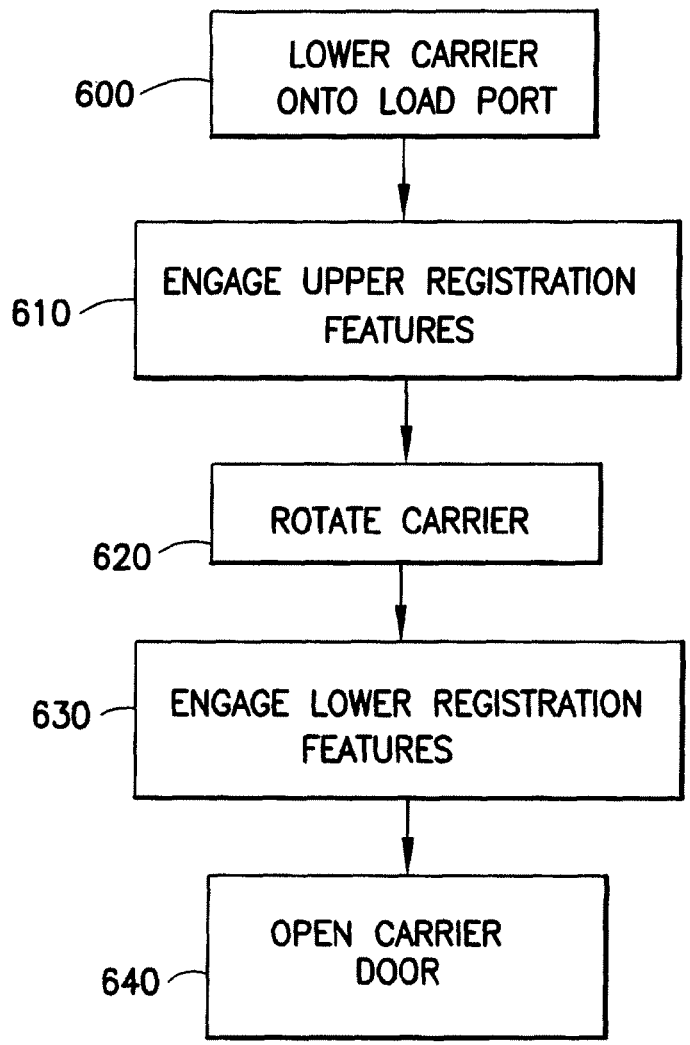
FIG. 6 shows a diagram of another method in accordance with an exemplary embodiment.

In operation, a transport, such as the overhead transport 320, lowers the carrier 300 onto the loadport 370 (FIG. 6, Block 600). The overhead transport 320 may be sufficiently aligned with the load port so that the upper recess(es) 301 of the carrier 300 are substantially aligned with the upper pin(s) 390 of the loadport 370. As the upper recess(es) 301 and upper pin(s) 390 engage they are forced into alignment (e.g. a longitudinal centerline of the recess aligns with a longitudinal centerline of the pin) by the weight of the carrier (FIG. 6, Block 610). The weight of carrier acting at the center of gravity 305 of the carrier 300 causes a rotation of the carrier 300 about the engagement point between the upper recess(es) 301 and upper pin(s) 390 so that the lower recess(es) 302 and lower pin(s) are urged into engagement to form a mechanically stable mounted or coupled condition between the carrier 300 and load port 370 (FIG. 6, Blocks 620, 630). The sealing surface 310 may prevent the atmosphere outside the carrier 300 and/or loadport 370 from entering inside the carrier 300 and/or loadport 370 when the carrier 300 and loadport 370 are coupled together. The port door 340 may also have a seal that seals any atmosphere that may be trapped between the port door 340 and the carrier door 330 from escaping or entering into the carrier 300 and/or loadport 370.

The port door 340 may engage the carrier door 330 through a suitable coupling, such as a mechanical or solid state coupling, to remove the carrier door 330 from the carrier 300 (e.g. open the door) so that the substrate 120 may be accessed by, for example, a transport apparatus located within the loadport 370. The wedge shaped or otherwise angular configuration of the carrier door 330 and the angled engagement surface 304, 372 between the carrier 300 and the loadport 370 may allow a port door opener 360 to remove/install the carrier door 330 along a substantially vertical axis of motion 350 (FIG. 6, Block 640).

Figure 4:
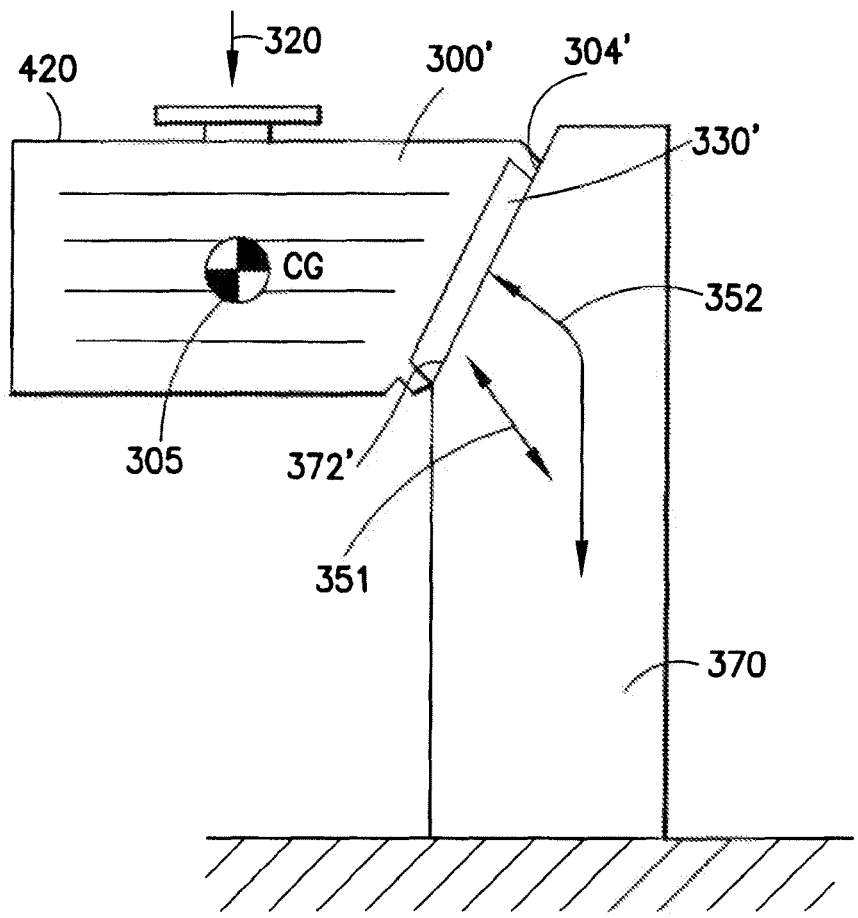
FIG. 4 illustrates another system in accordance with an exemplary embodiment.

Referring now to FIG. 4, a carrier/loadport interface is shown in accordance with another exemplary embodiment. The carrier 300' and loadport 370 may be substantially similar to the carrier and loadport described above unless otherwise noted. In this exemplary embodiment the carrier 300' is configured so that the carrier door 340' is mounted or attached to the carrier 300' at an angle with respect to the upper and lower surfaces 420, 410 of the carrier 300'. In this exemplary embodiment the door 330' is angled so that the door 330' faces towards the bottom 410 of the carrier 300'. In alternate embodiments, the carrier and carrier door may be configured so that the door faces towards the top or sides of the carrier. The angled door may provide a continuous and substantially flat surface for sealing the carrier to the loadport and port door.

The carrier 300' may have registration features substantially similar to those described above with respect to FIGS. 3A-3C located on the carrier face 304'. The loadport may also have registration features substantially similar to those described above with respect to FIGS. 3A-3C located on the port face 372' that cause alignment of the carrier to the loadport. For example, referring again to FIGS. 3B and 3C, the carrier interface 304' may have registration features such as those described above. The registration features may have any suitable configuration such as, for example, the triangular pattern shown in FIG. 3C and described above. In this exemplary embodiment a center of gravity 305 of the carrier 300' is utilized to impart the forces that preload the coupling in the mechanically stable condition shown in FIG. 4 and described above. As also noted above, in alternate embodiments the forces for the mechanically stable condition may be obtained in any suitable manner such as for example, by springs, guides, levers, linear or rotational actuators and the like acting on the cassette.

The loadport 370 may include upper pin(s) 390 that may engage the upper recess(es) 301 before the lower pin(s) 395 engage the lower recess(es) 302. The recess(es) 301, 302 may be located at any suitable location on the carrier 300' such as at the carrier interface 304'. Reactive forces F2 and F3 exerted by the upper pin(s) 390 on the upper recess(es) 301 acting simultaneously with the gravitational forces present at the center of gravity 305 of the carrier 300' may impart a moment My causing the carrier to rotate about the engagement point(s) between the upper pin(s) 390 and the upper recess(es). The moment My may also effect the locking together or securing of the engagement between the upper pin(s) and upper recess(es). The rotation or moment My about the upper engagement point(s) may urge the lower recess(es) 302 to engage the lower pin(s) 395 so that reactive forces F1 and F4 are exerted on the carrier 300' to prevent further rotation of the carrier 300'. In this exemplary embodiment the engagement between the upper and lower registration features holds the carrier 300' on the loadport 370. As noted above, in alternate embodiments, a live support may be utilized to assist in holding the carrier 300' on the loadport 370.

In operation, the carrier 300' may be transported onto the loadport where it is coupled and aligned to the loadport via the registration features in a manner substantially similar to that described above with respect to FIGS. 3A-3C. However, in this exemplary embodiment the opening of the carrier door 330' differs from that described above. As will be described below the removal/installation of the carrier door may occur at an angle. The angled path of the door allows for a reduced loadport footprint.

The port door may engage the carrier door 330' through a suitable coupling such as a mechanical or solid state coupling, to remove the carrier door 330' from the carrier 300' (e.g. open the door) so that the substrate 120 may be accessed by, for example, a transport apparatus located within the loadport 370. The angled configuration of the carrier door 330' and the angled engagement surface 304', 372' between the carrier 300' and the loadport 370 may allow the port door opener to remove/install the carrier door 330' along an angular axis of motion 351 so that the carrier door is removed in a direction substantially perpendicular to the carrier face 304' (FIG. 6, Block 640). In alternate embodiments the port door opener may remove/install the carrier door 330' along a path that combines an angular path with a vertical path of motion (see e.g. path 352 in FIG. 4) such that the carrier door is removed along the angular path until sufficient clearance exists between the door 330' and the carrier/loadport face. When the carrier door and loadport door are cleared from the carrier/port interface the carrier door may be transported along a substantially vertical path of motion to allow access to the substrate within the carrier. In still other alternate embodiments any suitable path of motion may be utilized to remove/install the carrier door.

It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A method for pressurizing a substrate carrier comprising:
   pressurizing a chamber that is of unitary construction with the carrier and/or a substrate cassette within the carrier;
   maintaining a pressure within the carrier by releasing gas from the chamber into the carrier;
   monitoring the pressure within the carrier and/or chamber;
   reporting an alarm if the pressure is below a predetermined level; and
   commanding a handling system to transport the carrier to a chamber replenishing station from a location remote from the chamber replenishing station.

2. The method of claim 1, wherein pressurizing the chamber includes pressurizing the chamber at a first location and the method further comprises moving the substrate carrier to a second location that is remote from the first location, where the pressure within the carrier is remotely maintained by the chamber.

3. The method of claim 1, wherein maintaining the pressure within the carrier includes regulating the amount of gas released from the chamber into the carrier and preventing over-pressurization of the carrier.

4. The method of claim 1, further comprising:
   sending periodic signals concerning the pressure within the carrier and/or chamber from the carrier to a handling system controller, wherein the controller predicts when replenishment is needed.

5. A substrate transport system comprising:
   a substrate transport carrier having:
      a casing for holding and carrying a substrate substantially isolated from an outside atmosphere, the casing having at least one chamber capable of holding the substrate and a chamber atmosphere different from the outside atmosphere,
      a portable gas supply connected to the casing so that the gas supply and casing are movable as a unit, the gas supply being arranged to hold a supply of gas and to controllably exhaust gas from the supply into the at least one chamber so that the chamber atmosphere is maintained at a predetermined pressure, and
      a pressure monitoring unit connected to the substrate transport carrier, the pressure monitoring unit being configured to monitor the pressure within the at least one chamber and/or the portable gas supply and report an alarm if the pressure is below a predetermined level; and
   a handling system having a controller, the handling system being configured to transport the substrate transport carrier;
   wherein the pressure monitoring unit is configured to report the alarm to the controller of the handling system if the pressure is below a predetermined level, and the controller is configured to command the handling system to transport the substrate transport carrier to a portable gas supply replenishing station from a location remote from the portable gas supply replenishing station.

6. The system according to claim 5, wherein the casing forms another chamber that defines the gas supply.

7. The system according to claim 5, wherein the portable gas supply is removably coupled to the casing.

8. The system according to claim 5, wherein the portable gas supply replenishing station is configured to pressurize the portable gas supply, and the portable gas supply effects remote maintenance of the chamber atmosphere when the substrate transport carrier is at a second location remote from the portable gas supply replenishing station.

* * * * *